US006794884B2

(12) United States Patent
Kliman et al.

(10) Patent No.: US 6,794,884 B2
(45) Date of Patent: *Sep. 21, 2004

(54) METHOD AND SYSTEM FOR EVALUATING CORE STACK PRESSURE

(75) Inventors: Gerald Burt Kliman, Niskayuna, NY (US); John Andrew Mallick, Dripping Springs, TX (US); Manoj Ramprasad Shah, Latham, NY (US); Sang Bing Lee, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 57 days.

This patent is subject to a terminal disclaimer.

(21) Appl. No.: 10/142,342

(22) Filed: May 10, 2002

(65) Prior Publication Data

US 2003/0210059 A1 Nov. 13, 2003

(51) Int. Cl.[7] .................. G01R 31/06; G01R 33/12
(52) U.S. Cl. ......................... 324/545; 324/228
(58) Field of Search ................... 324/545, 228

(56) References Cited

U.S. PATENT DOCUMENTS

| | | | |
|---|---|---|---|
| 4,230,961 A | 10/1980 | Calfo et al. ............. | 310/68 R |
| 4,996,486 A | 2/1991 | Posedel .................. | 324/545 |
| 5,028,869 A | 7/1991 | Dobmann et al. | |
| 5,990,688 A | 11/1999 | Bourgeois et al. ...... | 324/545 |
| 6,163,157 A | 12/2000 | Oldenkamp ............. | 324/545 |
| 6,469,504 B1 * | 10/2002 | Kliman et al. .......... | 324/228 |
| 6,489,781 B1 * | 12/2002 | Kliman et al. .......... | 324/545 |
| 2003/0210059 A1 | 11/2003 | Kliman et al. | |

FOREIGN PATENT DOCUMENTS

| | | |
|---|---|---|
| DE | 3442389 | 6/1985 |
| GB | 2 044 936 A | 8/1979 |
| SU | 1070661 | 1/1984 |

OTHER PUBLICATIONS

C. Rickson, et al, "Electrical Machine Core Imperfection Detection", IEE Proceedings B (Electric Power Applications) vol. 133, Pt B, No. 3, May 1986, pp. 190–195.

JW Shelton, et al, "Introduction and Qualification of Digital Electromagnetic Core Imperfection Detector (EL CID) Test Equipment and Associated Robotic Delivery and Inspection Systems", Proceedings of the American Power Conference (56th), vol. 2, 1994, pp. 1735–1742.

(List continued on next page.)

Primary Examiner—Jay Patidar
Assistant Examiner—Timothy J. Dole
(74) Attorney, Agent, or Firm—Ann M. Agosti; Patrick K. Patnode (57) ABSTRACT

A method for evaluating core stack pressure includes: positioning a magnetic yoke near the core, the magnetic yoke being wound by an excitation winding; supplying current to the excitation winding to inject magnetic flux into the core; measuring a signal resulting from the injected magnetic flux; and using the measured signal to evaluate the core stack pressure. A system for implementing the method includes the magnetic yoke; a current supply for supplying the current; a sensor for measuring the signal; and a computer for using the measured signal to evaluate core stack pressure.

29 Claims, 5 Drawing Sheets

OTHER PUBLICATIONS

JW Shelton, et al, "A Comparative Analysis of Turbogenerator Core Inspection Techniques", Proceedings of the American Power Conference (47th), 1985, pp. 643–650.

DJ Cadwell, et al, "Fast Gen III", The Proceedings of the American Power Conference, vol. 58-11, 1996, pp. 1249–1255.

J. Sutton, "Theory of Electromagnetic Testing of Laminated Stator Cores", Insight, vol. 36, No. 4, Apr. 1994, p. 246–251.

U.S. patent application, Ser. No. 09/575,715 Filed Jul. 28, 2000 by GB Kliman, et al, Entitled "Method and System for Detecting Core Faults".

U.S. patent application, Ser. No. 09/681,802 Filed Jun. 7, 2001 by GB Kliman, et al, Entitled "Method and System for Detecting Core Faults".

A Copy of the Search Report Dated Jan. 3, 2004. is Enclosed. PCT/US03/16133.

* cited by examiner

METHOD AND SYSTEM FOR EVALUATING CORE STACK PRESSURE

BACKGROUND

The invention relates to evaluation of core stack pressure.

When machine stator or rotor laminations become loose, the laminations vibrate. Lamination vibrations can damage machine lamination and winding insulation.

Conventional testing for inadequate core stack pressure involves attempting to insert a knife blade between adjacent laminations in a core stack, and, if the knife blade fits, determining that the core stack pressure is likely not sufficient. Typically pressures below the range of about 250 pounds per square inch (psi) (1724 kilonewton per meters squared –k N/m$^2$) to about 350 psi (2413 k N/m$^2$) fail the knife blade test. Several limitations of the knife blade test are imprecision (because the technique is qualitative and based on a pass-fail test) and the potential for lamination insulation damage.

It would be desirable to have an evaluation method that does not require inserting a knife blade between adjacent laminations of the core.

BRIEF SUMMARY

Briefly, in accordance with one embodiment of the present invention, a method for evaluating core stack pressure comprises: positioning a magnetic yoke near the core, the magnetic yoke being wound by an excitation winding; supplying current to the excitation winding to inject magnetic flux into the core; measuring a signal resulting from the injected magnetic flux; and using the measured signal to evaluate the core stack pressure.

In accordance with another embodiment of the present invention, a system for evaluating core stack pressure comprises: at least one magnetic yoke wound by an excitation winding for being positioned near at least one tooth of the core; a current supply for supplying current to the excitation winding to inject magnetic flux into at least one tooth of the core; a sensor for measuring a signal resulting from the injected magnetic flux; and a computer for using the measured signal to evaluate core stack pressure.

In accordance with another embodiment of the present invention a system for evaluating core stack pressure comprising: at least one magnetic yoke wound by an excitation winding for being positioned near at least one tooth of the core; means for supplying current to the excitation winding to inject magnetic flux into the at least one tooth of the core; means for measuring a signal resulting from the injected magnetic flux; and means for using the measured signal to evaluate core stack pressure.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF THE INVENTIONS

As described in commonly assigned Kliman et al., U.S. patent application Ser. No. 09/575,715, filed Jul. 28, 2000, which is herein incorporated by reference in its entirety, core faults may be detected by positioning a magnetic yoke wound by a winding near at least one tooth of the core; supplying current to the winding to inject magnetic flux into the at least one tooth; measuring at least one signal resulting from the injected magnetic flux; and using the measured signal to detect core faults. When a small portion of the core is excited, if the laminations are well insulated from each other, the flux response to the excitation will be primarily due to the permeable core material as modified by normal hysteresis losses and eddy currents in the laminations.

It has been discovered that the magnetic yokes described in U.S. patent application Ser. No. 09/575,715 are additionally useful for obtaining signals which can be used for evaluating core stack pressure in accordance with several embodiments of the present invention. The core losses produced in a magnetic material operating in an alternating magnetic field can be separated into three components: hysteresis loss, eddy current loss, and rotational loss. A semi-empirical formula for the hysteresis loss, $P_h$ (Watts per meters cubed—W/m$^3$) is shown by:

$$P_h = k_h B^{1.6} f, \quad (1)$$

where B is the maximum flux density (Tesla—T), f is the excitation frequency (Hertz—Hz), and $k_h$ is defined as the hysteresis loss coefficient. Although equation (1) can be used for most magnetic materials for B ranging from about 0.5 T to about 1.5 T, the value of the exponent 1.6 ranges between 1.5 and 2.5 and may not be constant for some materials. The eddy current loss, $P_e$ (W/m$^3$), can be described as:

$$P_e = \frac{\pi^2}{\rho \beta} t^2 B^2 f^2 = k_e B^2 f^2, \quad (2)$$

where t is the thickness of the lamination (meter—m), ρ is the resistivity of the lamination material (ohm meters—ohm-m), β is a coefficient that has different values for different geometries (typically equals about 6 for laminations having thicknesses ranging from about 4 mils (100 micrometers) to about 40 mils (1 millimeter)) and $k_e$ is defined as the eddy current loss coefficient. It is recommended that the coefficients $k_h$ and $k_e$ be determined experimentally because using (1) & (2) for loss calculation can yield errors due to assumptions made in the derivation. The two equations shown above are useful for understanding the qualitative functional relationship between the loss and variables B, f, and t.

When testing does not involve rotation of the alternating magnetic field (no rotational losses), the measured core loss, $P_c$ (W/m$^3$), primarily has hysteresis and eddy current loss components:

$$P_c = P_h + P_e = k_h B^{1.6} f + k_e B^2 f^2. \quad (3)$$

It has been observed that $P_c$ varies with mechanical stress. The sensitivity of the core tightness estimation can be further increased if the measured $P_c$ can be separated into $P_h$ and $P_e$.

Although (1) and (2) do not precisely describe the core loss, it is valid to assume that the core loss consists of components that vary with frequency ($P_h$) and square of the frequency ($P_e$), as can be seen in (1)–(3). As can be seen in (3), if the core loss can be measured for several different frequencies under a fixed flux density condition, the two loss components can be easily and accurately separated without making assumptions regarding the material or geometry of the lamination. Assuming that the flux density can be regulated at a fixed value, (3) can be simplified to the following:

$$P_c = P_h + P_e = C_h f + C_e f^2, \quad (4)$$

where, $C_h$ and $C_e$ are defined as the hysteresis and eddy current loss constants.

Figure 1:
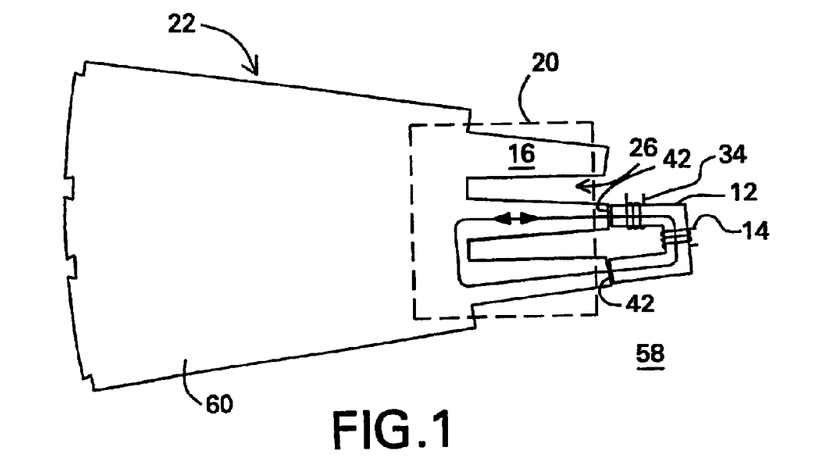
FIG. 1 is a top view of a test assembly in accordance with one embodiment of the present invention.
Figure 2:
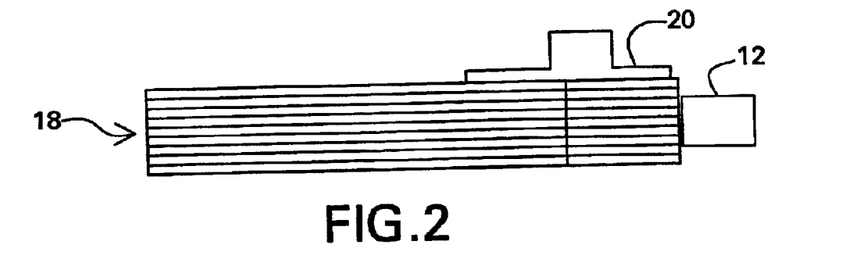
FIG. 2 is a side view of the test assembly of FIG. 1.
Figure 3:
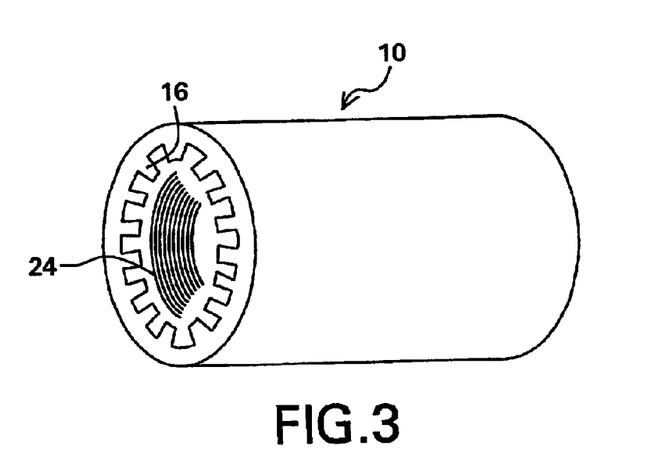
FIG. 3 is a schematic perspective view of a conventional machine core.

FIG. 1. is a top view of a test assembly 58 in accordance with one embodiment of the present invention, and FIG. 2 is a side view of the test assembly of FIG. 1. FIG. 3 is a schematic perspective view of a conventional machine core 10. Large generator lamination segments 22 typically including a back iron 60, teeth 16 and slots 26. Lamination segments (each about 10 mils (254 microns) to about 20 mils (508 microns) thick) are formed into a magnetic core by stacking. Typically a plurality of lamination segments (eighteen lamination segments each being twenty degrees, for one example) are used to form a complete first lamination ring (a lamination ring 24 is represented in FIG. 3, for example) with the next plurality of lamination segments forming a complete second lamination ring on top of and offset from the lamination segments in the first lamination ring. The stacking continues until formation of a short stack (a partial side view of a stack 18 is represented in FIG. 2, for example) of about 1 inch (2.54 centimeters) to about 4 inches (10.16 centimeters) thick. A plurality of short stacks are further joined and/or clamped by bolts and/or other mechanical devices to form a stator core. A typical generator stator core has a diameter ranging from about 3 feet (0.91 meters) to about 12 feet (3.66 meters) and a length ranging from about 3 feet (0.91 meters) to about 30 feet (9.14 meters).

Figure 4:
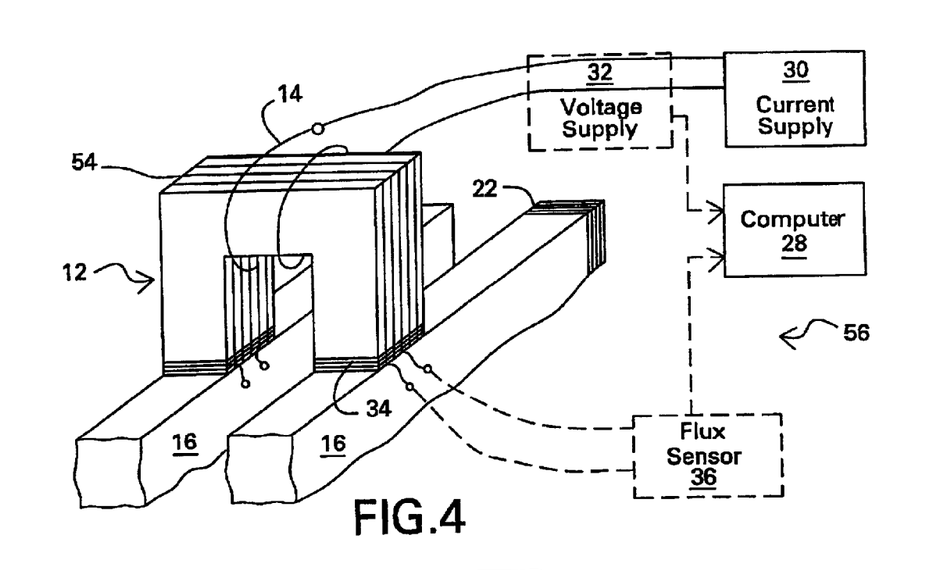
FIG. 4 is a perspective view of a system in accordance with one embodiment of the present invention.

FIG. 4 is a perspective view of a system in accordance with one embodiment of the present invention wherein a method for evaluating core 10 stack 18 pressure comprises: positioning a magnetic yoke 12 near core 10, magnetic yoke 12 being wound by an excitation winding 14; supplying current (via current supply 30, for example) to excitation winding 14 to inject magnetic flux into core 10; measuring a signal resulting from the injected magnetic flux; and using the measured signal to evaluate the core stack pressure (via a computer 28, for example). The word "near" is meant to include actual physical contact or close enough proximity so that the resulting signal has sufficient resolution for stack pressure evaluation. In one embodiment, for example, the distance between magnetic yoke 12 and core 10 ranges from about 0 inches to about 0.1 inches (2540 microns). In a more specific embodiment, the distance between magnetic yoke 12 and core 10 ranges from about 0.01 inches (254 microns) to about 0.05 inches (1270 microns).

In a more specific embodiment, using the measured signal to evaluate the core stack pressure comprises obtaining an hysteresis loss signal from the measured signal and using the hysteresis loss signal to evaluate the core stack pressure. In a still more specific embodiment, as further discussed below, obtaining the hysteresis loss signal from the measured signal comprises using a polynomial fit function.

Figure 5:
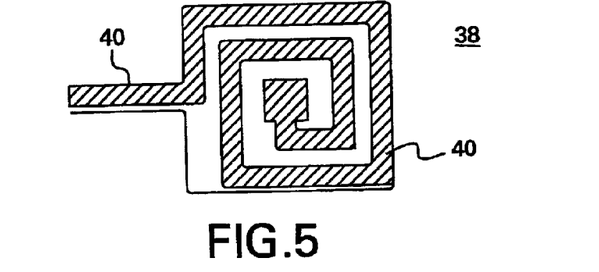
FIG. 5 is a bottom view of a flux sensing coil for use in accordance with one embodiment of the present invention.

FIGS. 6–9 are views of magnetic yokes that can be used in accordance with other embodiments of the present invention with similar steps and mechanisms that are discussed, for purposes of example, with respect to FIG. 4. FIG. 5 is a bottom view of a flux sensing coil 38 for use in accordance with a specific flux sensing embodiment of the present invention. Any of the embodiments of FIGS. 4–9 can be used singly or in combination with one or more others of the embodiments.

Figure 7:
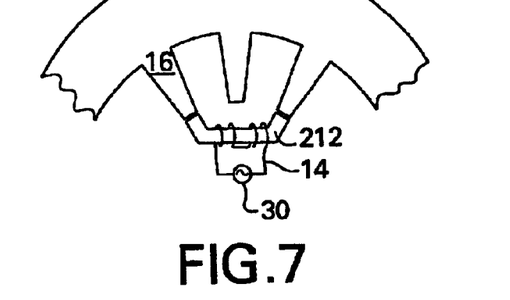
Figure 8:
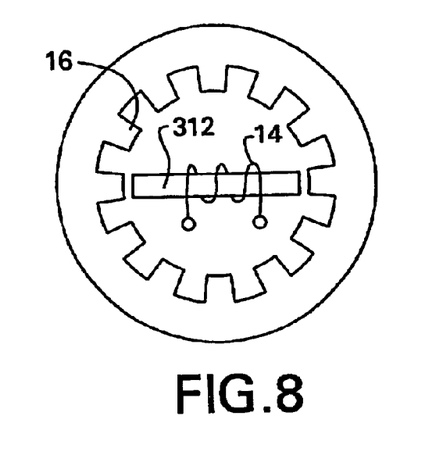
Figure 9:
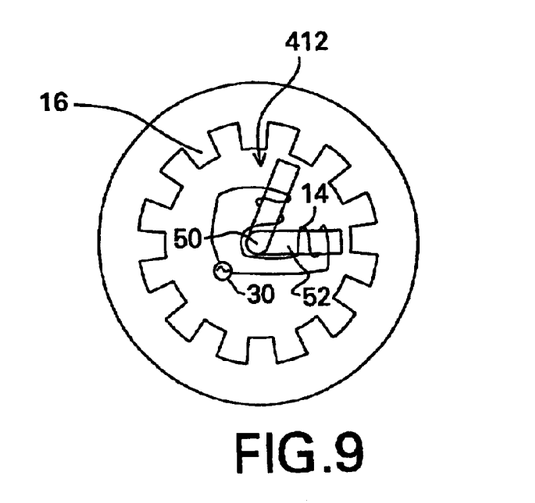
Figure 10:
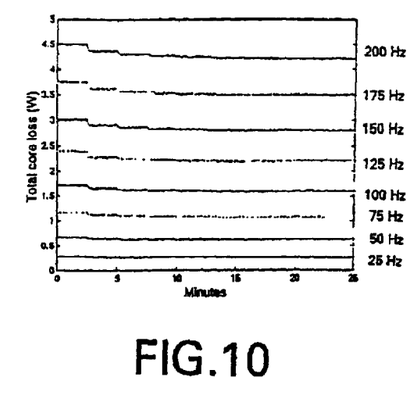
FIGS. 10–19 are graphical representations of data obtained from using the test assembly of FIGS. 1–2.

More specifically, in the embodiment of FIG. 4, magnetic yoke 12 is positioned near two teeth, and, even more specifically is a U-shaped (meaning U-shaped or C-shaped) yoke positioned near two adjacent teeth. Although adjacent teeth are shown in FIG. 4, the two teeth may have another tooth or multiple teeth therebetween as shown in FIGS. 7–9, for example.

Referring again to FIG. 4 for purposes of example, FIG. 4 illustrates two alternative or cumulative options for a sensor (meaning at least one sensor) for measuring a resulting signal. In one example, a voltage sensor 32 is used to measure voltage across excitation winding 14. In another example, magnetic yoke 12 is further wound with at least one flux sensing winding 34, and flux (magnitude and/or phase angle) is measured on the flux sensing winding by flux sensor 36. In another embodiment, a flux sensing winding 38 (FIG. 5) comprises at least one planar coil 40, and magnetic yoke 12 comprises two core-facing surfaces 42 (FIG. 1) with the flux sensing winding being situated on at least one of the two core-facing surfaces. An advantage of using a planar coil is that such coils can be fabricated as thin films. In one example, a coil having several turns has a thickness of about 0.0762 millimeters with each side of the coil being about 0.7620 millimeters long. Planar coils can be fabricated by standard metallization and patterning techniques using conventional printed circuit board or chip interconnection material such as copper, for example. In a preferred variation of the flux measuring embodiments of FIGS. 4–9, flux sensing windings are present near both teeth. Resulting signals can be processed by a computer 28 which is adapted to use the signals to detect core stack pressure.

In the embodiment illustrated in FIG. 4, magnetic yoke 12 typically comprises a laminated (laminations 22) U-shaped yoke, teeth 16 comprise laminated (laminations 54) teeth of a laminated core, and the magnetic yoke and core have the same direction of lamination as can be seen by laminations 54 and 22. In a more specific embodiment, the yoke comprises unbonded (that is, free to move) laminations about 14 mils (356 microns) thick and has a total thickness and height of about 1 inch (2.54 centimeters) by 1 inch (2.54 centimeters). The common direction of lamination embodiment is for purposes of example only. In one alternative embodiment (not shown) wherein the yoke comprises a tape wound yoke, the direction of magnetic yoke 12 laminations is perpendicular to the direction of core laminations, for example. In other alternative embodiments, the relative lamination directions range at any angle from about zero degrees to about 90 degrees, for example.

Figure 6:
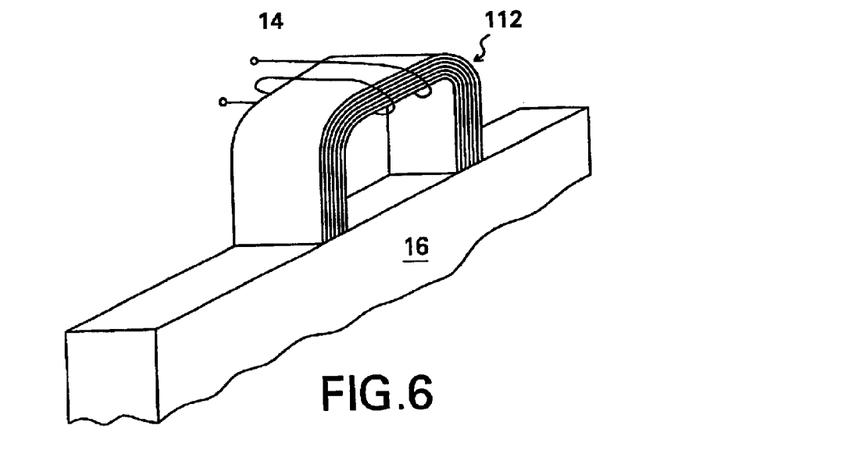
FIGS. 6–9 are views of magnetic yokes that can be used in accordance with other embodiments of the present invention.

In one embodiment, as shown in FIG. 6, magnetic yoke 112 is positioned near one tooth 16 of core 10. In this embodiment, it is particularly useful for laminations of magnetic yoke 112 to be aligned with laminations of core 10.

In the embodiment of FIG. 7, magnetic yoke 212 is adapted for being positioned near two non-adjacent teeth 16. In this embodiment, it is expected that magnetic flux can travel more deeply into the back iron 60 (FIG. 1) portion of core 10 (FIG. 3) than in the embodiment of FIG. 4.

In FIG. 8, magnetic yoke 312 comprises a laminated bar spanning a plurality of teeth and preferably having rectangular laminations which are again parallel to laminations of teeth 16.

The embodiment of FIG. 9 is a variation wherein magnetic yoke 412 is adapted for being positioned at any of a number of angles. More specifically, in FIG. 9, magnetic yoke 412 comprises two arms 52 coupled by a hinge 50. In an alternative embodiment, yokes without hinges can be fabricated with predetermined angles.

Regardless of which of the one or more magnetic yoke embodiments is selected, the steps of supplying current, measuring the resulting signal, and using the measured signal to detect core stack pressure are typically repeated such that a plurality of signals are used to detect core stack pressure. The measurements can be performed, for example, by axially moving the magnetic yoke relative to the at least one tooth. Preferably, measurements are made until all regions of the core have been tested.

EXPERIMENT

The feasibility of using the local hysteresis loss estimate in a machine stator as a measure of core stack pressure (tightness) was evaluated by using measurements obtained from a laboratory setup for showing the relationship between the core loss (hysteresis loss) estimate and core tightness. The experimental setup for measuring the core loss in the laminations as a function of pressure is shown in FIGS. 1–2. Thirty sheets of oriented silicon steel lamination samples were placed in a press 20 where pressure was applied. Flux was injected into laminations 22 through teeth 16 using a magnetic yoke 12. The flux density in flux sensing winding 34 was regulated at about 1 Tesla by controlling the input voltage to excitation winding 14, and the values of the excitation frequency and pressure level on laminations 22 were varied as shown in (5) and (6), respectively.

$$f=\{25, 50, 75, 100, 125, 150, 175, 200\} \text{ (Hz)}$$
$$P=\{0, 25, 50, 75, 100, 150, 200, 250, 300, 350\} \text{ (psi)} \quad (5)$$

or $$P=\{0, 172, 345, 517, 689, 1034, 1379, 1724, 2068, 2413\} \text{ (N/m}^2\text{)} \quad (6)$$

The core loss in the lamination was calculated using the excitation coil current and the sensing coil voltage to exclude the resistive loss in the excitation coil. A commercial power analyzer was used for calculating the average power loss in the lamination and excitation core.

The pressure on the experimental setup was varied between 0 and 350 psi (2413 k N/m$^2$) in intervals shown in equation (6) for each excitation frequency shown in equation (5). To repeat the experiment under the same conditions, the position of the excitation core was fixed with respect to the laminations to obtain results insensitive to air gap variation, vibration, and tilting of the excitation core. For each excitation frequency, the pressure level was manually increased every 50 samples (the power analyzer provided a reading every 4.5 seconds). FIGS. 10–19 are graphical representations of data (with suppressed zeros) obtained from using the test assembly of FIGS. 1–2.

Figure 11:
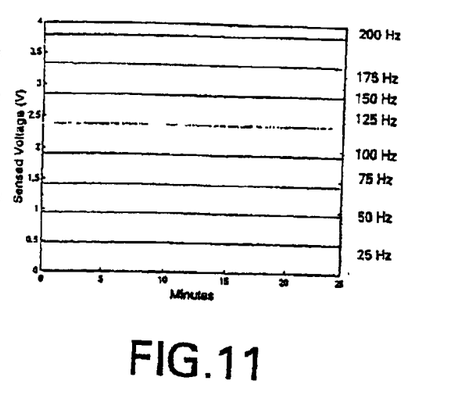
Figure 12:
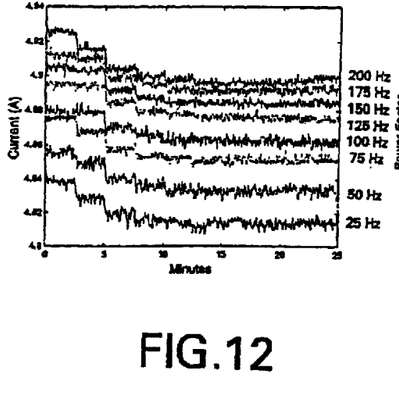
Figure 13:
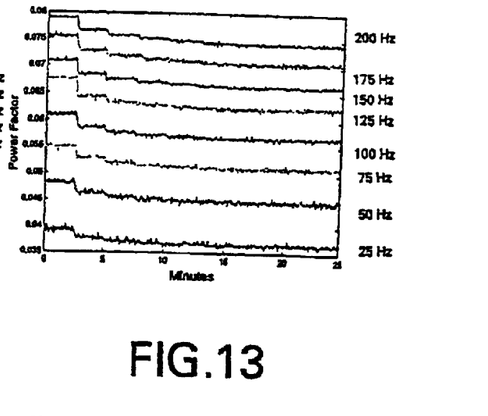
Figure 14:
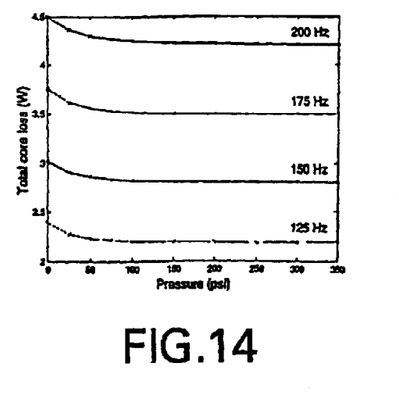
Figure 15:
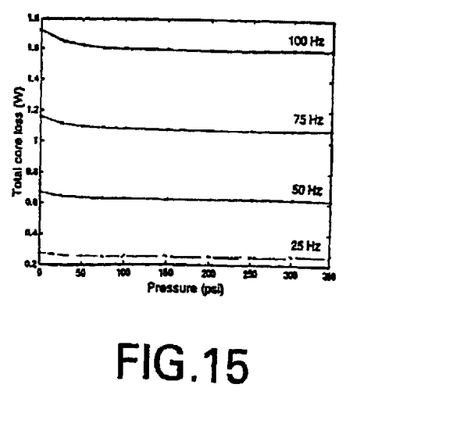

The measured core loss for each excitation frequency (FIG. 10) shows that the core loss decreases as the pressure level increases. The measured voltage in the sensing coil, the measured current in the excitation coil, and the measured power factor are shown in FIGS. 11–13, respectively. The calculated average of the core losses at 125 Hz, 150 Hz, 175 Hz, and 200 Hz are shown in FIG. 14 and the losses at 25 Hz, 50 Hz, 75 Hz, and 100 Hz are shown in FIG. 15. It can be clearly observed that the core loss decreases significantly for each excitation frequency from zero psi up to about 200 psi (1379 k N/m$^2$) and then increases slightly with pressure thereafter.

Figure 16:
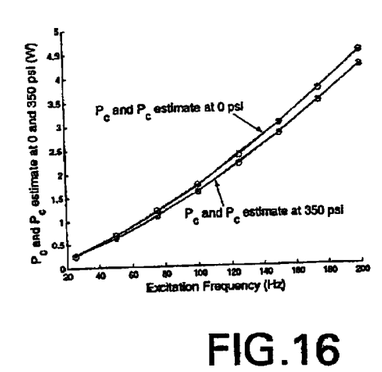
Figure 17:
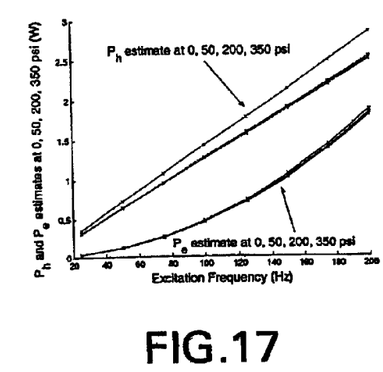

The measured core loss was separated into $P_h$ and $P_e$ using a polynomial fit function of MATLAB technical computing software (MATLAB is a trademark of The MathWorks, Inc.). The polynomial fit function estimates the coefficients of a specified order of a polynomial so that the mean square error between the estimated curve and given curve is minimized. In this case, the $P_c$–f curves for each pressure level were fitted to the second order so that $C_h$ and $C_e$ are estimated. The measured and estimated $P_c$ data are shown in FIG. 16 for 0 psi (0 N/m$^2$) and 350 psi (2413 k N/m$^2$), respectively. It can be seen that the measured curve can be estimated with high accuracy using the polynomial fit function. The estimates of the hysteresis and eddy current losses ($C_h f$ and $C_e f^2$) are shown in FIG. 17 for 0 psi (0 N/m$^2$), 50 psi (345 k N/m$^2$), 200 psi (1379 k N/m$^2$), and 350 psi (2413 k N/m$^2$). It can be seen that pressure has a much larger influence on the hysteresis loss compared to that of the eddy current loss, as predicted.

Figure 18:
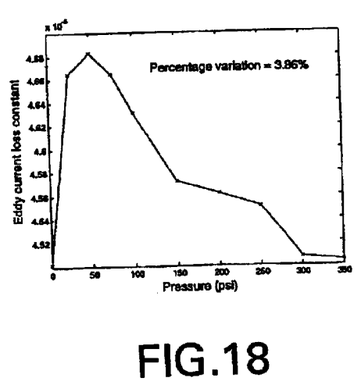
Figure 19:
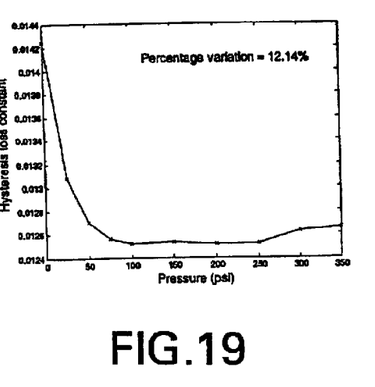

The estimates of the eddy current and hysteresis constants, $C_e$ and $C_h$, are shown in FIGS. 18–19, respectively. The percent variation in the $C_h$ (12.14%) was larger than that of $C_e$ (3.86%), and the trend of $C_h$ was consistent with the measured core loss shown in FIGS. 2(e) and (f), as predicted.

The results showed that the measured core loss increases significantly (6.5~8.5%) when the laminations are loose (0 psi or N/m$^2$), which indicates that the core loss can be used as a measure of core tightness. It was also shown that the sensitivity of core tightness estimation could be increased (12%) if the hysteresis loss component can be monitored alone by separating the hysteresis and eddy current loss; however, this involved the core loss measurements being obtained at several different excitation frequencies.

Although the above experiment was performed using sine wave type injection, the present invention is not intended to be limited to sine waves. Any appropriately shaped wave or wave pattern can be used. In one embodiment, for example, a square wave is used. In alternative or additional embodiments, amplitudes, frequencies, or a combination thereof, are varied.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for evaluating core stack pressure comprising:
   (a) positioning a magnetic yoke near the core, the magnetic yoke being wound by an excitation winding:
   (b) supplying current to the excitation winding to inject magnetic flux into the core;
   (c) measuring a signal resulting from the injected magnetic flux; and
   (d) using the measured signal to evaluate the core stack pressure.

2. The method of claim 1 wherein (d) comprises obtaining an hysteresis loss signal from the measured signal and using the hysteresis loss signal to evaluate the core stack pressure.

3. The method of claim 2 wherein obtaining the hysteresis loss signal from the measured signal comprises using a polynomial fit function.

4. The method of claim 1 wherein (a) comprises positioning the magnetic yoke near at least one tooth of the core.

5. The method of claim 4 wherein (d) comprises obtaining a hysteresis loss signal from the measured signal and using the hysteresis loss signal to evaluate the core stack pressure.

6. The method of claim 4 wherein (a) comprises positioning the magnetic yoke near two teeth.

7. The method or claim 6 wherein (a) comprises positioning the magnetic yoke near two adjacent teeth.

8. The method of claim 4 wherein (c) comprises measuring voltage across the excitation winding.

9. The method of claim 4 wherein (a) comprises positioning the magnetic yoke near two non-adjacent teeth.

10. The method of claim 4 further comprising repeating (a)–(c) and using the plurality of resulting measured signals to evaluate the core stack pressure in (d).

11. The method of claim 10 wherein, when repeating (a)–(c), positioning comprises axially moving the magnetic yoke relative to the at least one tooth.

12. The method of claim 4 wherein (c) comprises sensing a flux signal resulting from the injected magnetic flux.

13. A method for evaluating core stack pressure comprising:
   (a) repeating, at different positions of the core,
      (1) positioning a magnetic yoke near two teeth of the core, the magnetic yoke being wound by an excitation winding;
      (2) supplying current to the excitation winding to inject magnetic flux into the two teeth of the core; and
      (3) measuring a signal resulting from the injected magnetic flux; and
   (b) using the measured signals to evaluate the core stack pressure.

14. The method of claim 13 wherein (d) comprises obtaining a hysteresis lose signal from the measured signal and using the hysteresis loss signal to evaluate the core stack pressure.

15. The method of claim 14 wherein obtaining the hysteresis loss signal from the measured signal comprises using a polynomial fit function.

16. A system for evaluating core stack pressure comprising:
   (a) at least one magnetic yoke wound by an excitation winding for being positioned near at least one tooth of the core;
   (b) a current supply for supplying current to the excitation winding to inject magnetic flux into the at least one tooth of the core;
   (c) a sensor for measuring a signal resulting from the injected magnetic flux; and
   (d) a computer for using the measured signal to evaluate core stack pressure.

17. The system of claim 16 wherein the sensor comprises a voltage sensor for measuring voltage across the excitation winding.

18. The system of claim 16 wherein the at least one magnetic yoke is further wound with at least one flux sensing winding, and wherein the sensor comprises a flux sensor for measuring flux oft the flux sensing winding.

19. The system of claim 16 further comprising a flux sensing winding, wherein the sensor comprises a flux sensor for measuring flux on a flux sensing winding, and wherein the magnetic yoke comprises two core-facing surfaces and the flux sensing winding comprises at least one planar coil situated on at least one of the two core-facing surfaces.

20. The system of claim 16 wherein the at least one magnetic yoke comprises a U-shaped yoke or a bar-shaped yoke.

21. The system of claim 16 wherein the at least one magnetic yoke comprises a laminated U-shaped yoke, wherein the core comprises a laminated core, and wherein the at least one magnetic yoke and core have the same direction of lamination.

22. The system of claim 16 the at least one magnetic yoke is adapted for being positioned near two adjacent teeth.

23. The system of claim 16 wherein the at least one magnetic yoke is adapted for being positioned near two non-adjacent teeth.

24. The system of claim 16 wherein the at least one magnetic yoke is adapted for being positioned at any of a number of angles.

25. The system of claim 24 wherein the at least one magnetic yoke comprises two arms coupled by hinge.

26. The system of claim 16 wherein the at least one magnetic yoke is adapted for being positioned near one tooth.

27. The system of claim 16 wherein the computer is adapted for obtaining an hysteresis loss signal from the measured signal and using the hysteresis loss signal to evaluate the core stack pressure.

28. The system of claim 27 wherein the computer is adapted for obtaining the hysteresis loss signal from the measured signal by using a polynomial fit function.

29. A system for evaluating core stack pressure comprising:
  (a) at least one magnetic yoke wound by an excitation winding for being positioned near at least one tooth of the core;
  (b) means for supplying current to the excitation winding to inject magnetic flux into the at least one tooth of the core;
  (c) means for measuring a signal resulting from the injected magnetic flux; and
  (d) means for using the measured signal to evaluate core stack pressure.

* * * * *

UNITED STATES PATENT AND TRADEMARK OFFICE
CERTIFICATE OF CORRECTION

PATENT NO. : 6,794,884 B2
DATED : September 21, 2004
INVENTOR(S) : Gerald B. Kliman et al.

It is certified that error appears in the above-identified patent and that said Letters Patent is hereby corrected as shown below:

<u>Title page,</u>
Item [75], Inventors, please delete "Sang Bing Lee" and insert -- Sang Bin Lee --

Signed and Sealed this

Twenty-second Day of February, 2005

JON W. DUDAS
*Director of the United States Patent and Trademark Office*